(12) United States Patent
Aiello et al.

(10) Patent No.: US 7,798,892 B2
(45) Date of Patent: Sep. 21, 2010

(54) PACKAGING METHOD FOR MODULAR POWER CELLS

(75) Inventors: Marc F. Aiello, Oakmont, PA (US); Edward Alan Cheesman, Chicora, PA (US); Wayne Sheldon Jordan, Cranberry Township, PA (US)

(73) Assignee: Siemens Industry, Inc., Alpharetta, GA (US)

( * ) Notice: Subject to any disclaimer, the term of this patent is extended or adjusted under 35 U.S.C. 154(b) by 1056 days.

(21) Appl. No.: 11/515,294

(22) Filed: Aug. 31, 2006

(65) Prior Publication Data
US 2007/0048561 A1  Mar. 1, 2007

Related U.S. Application Data

(60) Provisional application No. 60/713,197, filed on Aug. 31, 2005.

(51) Int. Cl.
H05K 5/00 (2006.01)
H05K 7/20 (2006.01)
G06F 1/20 (2006.01)

(52) U.S. Cl. .................. 454/184; 361/679.47; 361/696
(58) Field of Classification Search ................ 454/184; 361/696, 679.47
See application file for complete search history.

(56) References Cited

U.S. PATENT DOCUMENTS

| | | | | |
|---|---|---|---|---|
| 2,960,633 A * | 11/1960 | Hall | ........................... | 361/688 |
| 3,280,284 A * | 10/1966 | Peppel | ........................ | 337/211 |
| 3,749,981 A * | 7/1973 | Koltuniak et al. | ........... | 361/696 |
| 4,582,765 A * | 4/1986 | Kothmann | .................... | 429/13 |
| 5,170,336 A | 12/1992 | Getter et al. | | |
| 5,560,999 A * | 10/1996 | Pedicini et al. | ............... | 429/27 |
| 5,571,630 A * | 11/1996 | Cheiky | ........................ | 429/26 |
| 5,625,545 A | 4/1997 | Hammond | | |
| 5,726,874 A | 3/1998 | Liang | | |
| 5,748,445 A | 5/1998 | North et al. | | |
| 5,831,847 A | 11/1998 | Love | | |
| 6,046,921 A | 4/2000 | Tracewell et al. | | |
| 6,119,768 A | 9/2000 | Dreier et al. | | |
| 6,166,937 A * | 12/2000 | Yamamura et al. | .......... | 363/141 |
| 6,232,006 B1 * | 5/2001 | Breault | ........................ | 429/26 |
| 6,743,536 B2 * | 6/2004 | Fuglevand | ..................... | 429/9 |
| 6,865,080 B2 | 3/2005 | Radosevich et al. | | |
| 6,909,607 B2 | 6/2005 | Radosevich et al. | | |
| 6,978,855 B2 * | 12/2005 | Kubota et al. | ................. | 429/13 |
| 2003/0007370 A1 | 1/2003 | Winter | | |

(Continued)

FOREIGN PATENT DOCUMENTS

JP        02054887 A * 2/1990

(Continued)

*Primary Examiner*—Steven B McAllister
*Assistant Examiner*—Patrick F. O'Reilly, III
(74) *Attorney, Agent, or Firm*—Filip A. Kowalewski

(57) ABSTRACT

A method of operating a power delivery system that has at least one power cell includes directing air into the power cells to cool them, receiving the air from the cells, directing the air to a cooling system, and recirculating the cooled air to the power cells. Each cell may include an air intake, an air output, a water-cooled heat sink, and optionally a plurality of capacitor connectors and/or a circuit board. The air may be directed through the air intake to the air output so that air passes over the capacitor connectors and/or the circuit board before passing over the heat sink.

12 Claims, 8 Drawing Sheets

U.S. PATENT DOCUMENTS

| | | |
|---|---|---|
| 2003/0133268 A1* | 7/2003 | Radosevich et al. ......... 361/704 |
| 2004/0095721 A1* | 5/2004 | Ellsworth et al. ........... 361/694 |
| 2005/0006963 A1* | 1/2005 | Takenaka et al. .............. 310/52 |
| 2005/0265002 A1* | 12/2005 | Armstrong et al. .......... 361/719 |
| 2005/0270927 A1* | 12/2005 | Hayashi ..................... 369/47.1 |
| 2007/0248861 A1* | 10/2007 | Hoshi .......................... 429/26 |

FOREIGN PATENT DOCUMENTS

JP            2005044551 A    *   2/2005

* cited by examiner

PACKAGING METHOD FOR MODULAR POWER CELLS

CROSS-REFERENCE TO RELATED APPLICATIONS

This patent application claims priority to, and incorporates by reference in its entirety, pending U.S. Provisional Patent Application Ser. No. 60/713,197, entitled "Packaging method for modular multilevel power cells and system infrastructure," filed Aug. 31, 2005. This patent application is also related to U.S. patent application Ser. No. 11/511,726, entitled "Packaging system for modular power cells," filed Aug. 29, 2006.

STATEMENT REGARDING FEDERALLY SPONSORED RESEARCH

Not applicable.

NAMES OF PARTIES TO A JOINT RESEARCH AGREEMENT

Not applicable.

INCORPORATION BY REFERENCE OF MATERIAL ON DISK

Not applicable.

BACKGROUND

1. Technical Field

This application relates generally to the field of power delivery systems.

2. Description of the Related Art

In recent years, circuits for medium-voltage variable frequency drive (VFD) applications have received attention. Several novel methods have been introduced in the past decade. For example, in a circuit comprising series-connected inverters as described in U.S. Pat. No. 5,625,545 to Hammond, the disclosure of which is incorporated herein by reference in its entirety, an inverter or power cell 110 includes a three-phase diode-bridge rectifier 112, one or more direct current (DC) capacitors 114, and an H-bridge inverter 116. The rectifier 112 converts the input 118 alternating current (AC) voltage to a substantially constant DC voltage that is supported by the capacitors 114 that are connected across the rectifier 112 output. The output stage of the inverter 110 includes an H-bridge inverter 116 that includes two poles, a left pole and a right pole, each with two devices. The inverter 110 transforms the DC voltage across the DC capacitors 114 to an AC output 120 using pulse-width modulation (PWM) of the semiconductor devices in the H-bridge inverter 116.

Other circuits and drives for medium voltage and high voltage motor control are available. In general medium voltage refers to a rated voltage greater than 690 volts (V) and less than 69 kilovolts (kV). In some embodiments, medium voltage may be a voltage between about 1000 V and about 69 kV. High voltage ratings exceed such medium voltage ratings. In many such systems, modular power cells are used. Industry often seeks ways to reduce the size of such systems, increase the life and reliability of the systems, and permit the systems to keep operating under on or more fault conditions.

The disclosure contained herein describes attempts to solve one or more of the problems described above.

SUMMARY

In an embodiment, a power delivery system includes a plurality of removable power cells positioned within a housing structure. Each power cell includes a water cooled heat sink, an air intake, and an air output. The system also includes a heat exchanger. Each cell may be positioned to receive air into the air intake and expel the air into an air plenum. The heat exchanger may be positioned to receive the air from the air plenum, cool the air, and recirculate the cooled air to the cells via each cell's air intake. During operation, the air that is expelled into the air plenum by a cell may be warmer than the air that is received into the air intake of the cell. In addition, each cell's heat sink may be connected to a water intake and a water output, and during operation, the water that is expelled through the water output by a cell may be warmer than the water that is received into the water intake of the same cell. In some embodiments, each power cell includes a plurality of capacitor connectors and a plurality of transistors. The capacitor connectors may be positioned closer to the air intake when compared to the position of the heat sink, and the heat sink may be positioned closer to the air outlet when compared to the position of the capacitor connectors. During operation, most air circulating through the cell may contact the capacitor connectors before contacting the heat sink. Each power cell also may include a circuit board that is positioned closer to the air intake when compared to the position of the heat sink. The system also may include a back plane positioned between the cells and the air plenum, a plurality of power delivery busses positioned within the air plenum to deliver power to the cells, and a plurality of power return busses positioned within the air plenum to receive power from the cells and deliver the power to a load. The system also may include a water delivery manifold and a water return manifold, such that each manifold comprises a plurality of self-sealing connections, wherein each connection opens when a cell is connected to the connection and closes when a cell is removed from the connection.

In an alternate embodiment a method of operating a power delivery system that has at least one power cell includes directing air into a power cell to cool the cell, and receiving the air from the power cell. The air received from the cell is warmer than the air directed into the cell. The method also includes cooling the received air to a desired temperature, such as 55° C. or any other temperature that is lower than the temperature of air that is expected to be expelled from the cell, and recirculating it to the power cell. The cell may be contained within a support structure having an air plenum. In such an embodiment, the cooling may be provided by a heat exchanger, and the receiving may include directing air through the air plenum from the cell to the heat exchanger. The cell may include an air intake, an air output, a water-cooled heat sink, and optionally a plurality of capacitor connectors and/or a circuit board. The air may be directed through the air intake to the air output so that air passes over the capacitor connectors and/or the circuit board before passing over the heat sink. The cell's heat sink may be connected to a water intake and a water output. During operation, water that is expelled through the water output by the cell may be warmer than water that is received into the water intake of the cell. The recirculating may reduce air ionization.

In an alternate embodiment, a method of operating a power delivery system having multiple power cells includes directing air into the power cells. Each cell includes an air intake, an air output, a water-cooled heat sink, and a plurality of capacitor connectors. The directing includes, for each cell, directing the air through the air intake, and passing the air over the water-cooled heat sink and the capacitor connectors so that the air passes over the capacitor connectors before passing over the heat sink. The air is recieved from each power cell, cooled and recirculated to the power cells. The cells may be contained within a support structure having an air plenum. The cooling may be provided by a heat exchanger, and the receiving may include directing air through the air plenum from the cells to the heat exchanger. Optionally, each cell's heat sink may be connected to a water intake and a water output. During operation, water that is expelled through the water output by each cell may be warmer than water that is received into the water intake of the cell. Each cell also may include a circuit board, and the passing may include passing the air over the circuit board before the air passes over the heat sink of each cell.

BRIEF DESCRIPTION OF THE DRAWINGS

FIG. 3A is a rear perspective view and FIG. 3B is a front perspective view of an exemplary power cell housing structure, while

DETAILED DESCRIPTION

Before the present methods, systems and materials are described, it is to be understood that this disclosure is not limited to the particular methodologies, systems and materials described, as these may vary. It is also to be understood that the terminology used in the description is for the purpose of describing the particular versions or embodiments only, and is not intended to limit the scope. For example, as used herein and in the appended claims, the singular forms "a," "an," and "the" include plural references unless the context clearly dictates otherwise. In addition, the term "comprising" is intended to mean "including but not limited to." Unless defined otherwise, all technical and scientific terms used herein have the same meanings as commonly understood by one of ordinary skill in the art.

Figure 1:
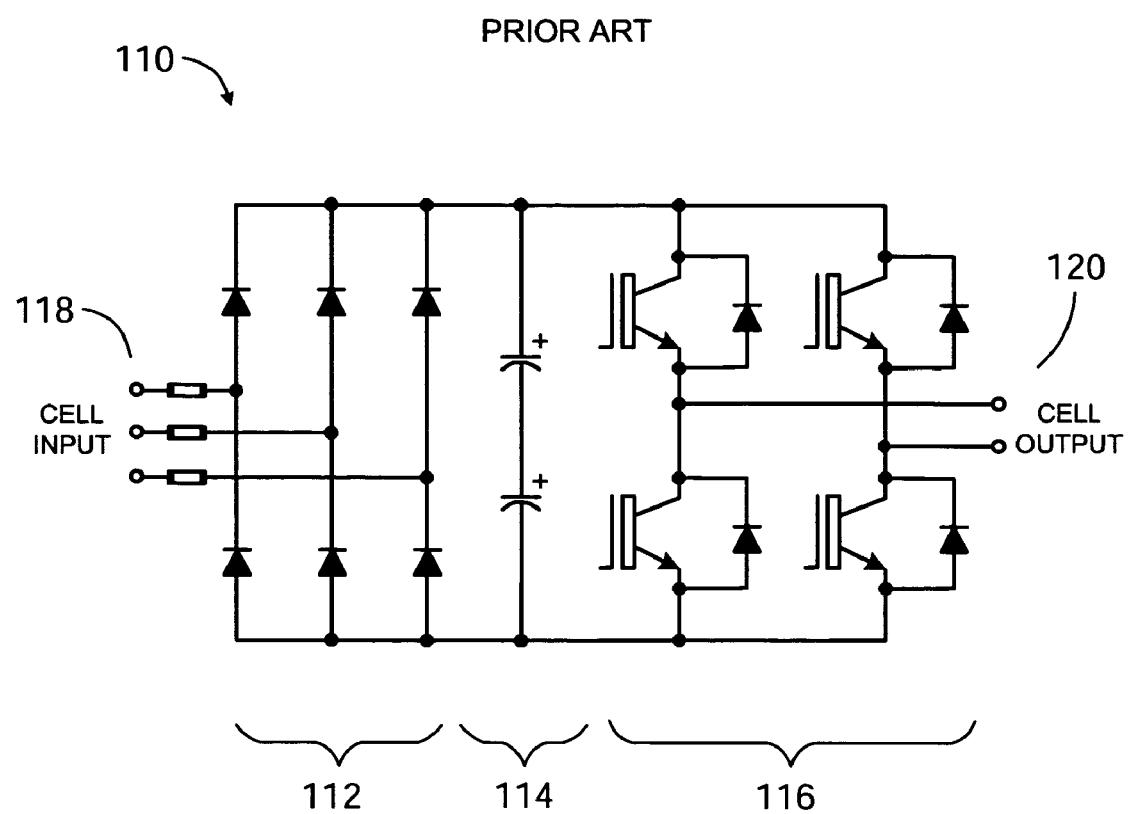
FIG. 1 is a circuit diagram illustrating exemplary features of a prior art power cell.
Figure 2:
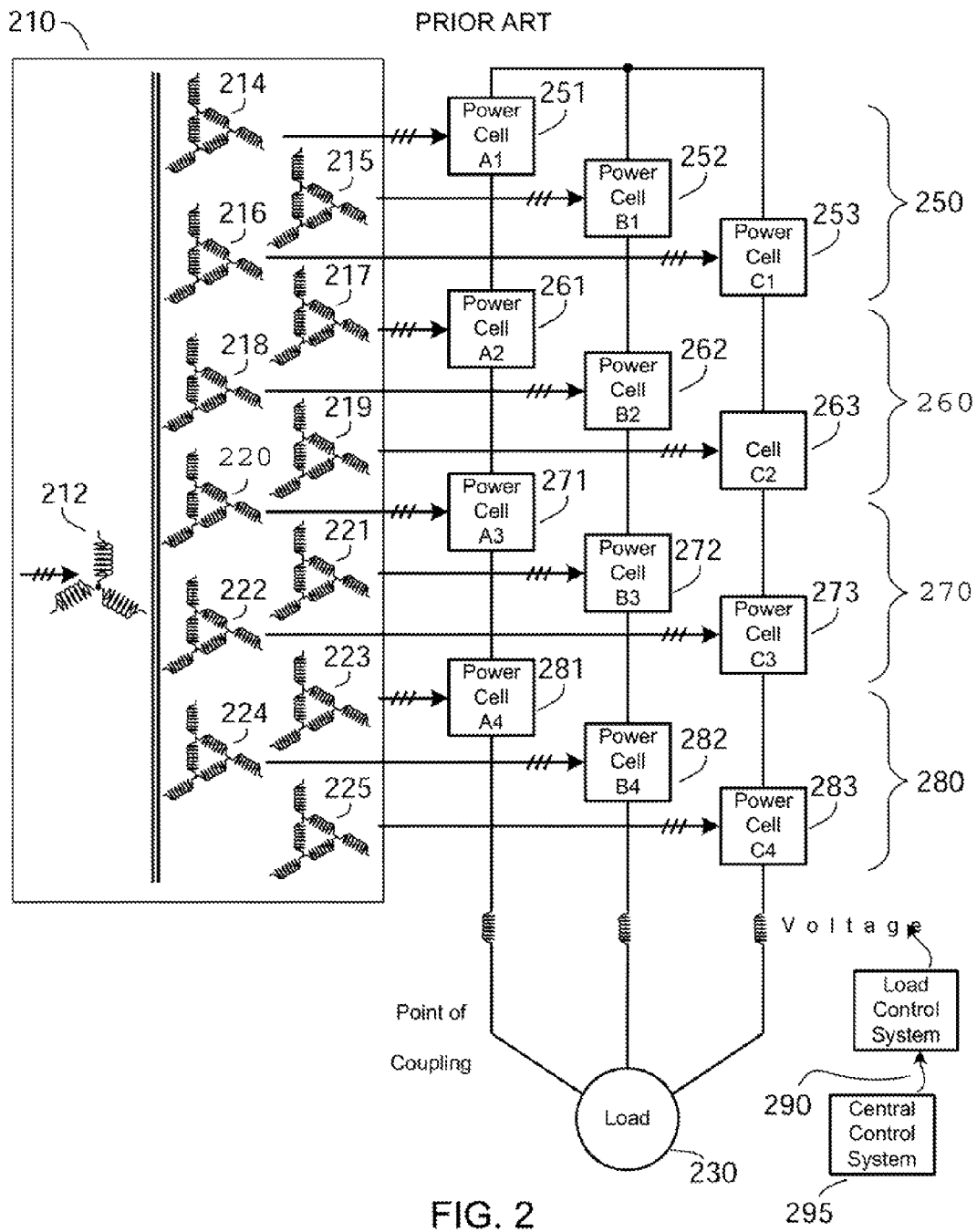
FIG. 2 depicts a circuit comprising a plurality of power cells connected to a load.

In various embodiments, a multi-level power circuit may include a plurality of power cells to drive a load. FIG. 2 illustrates an exemplary embodiment of a circuit having such power cells. In FIG. 2, a transformer 210 delivers three-phase, medium-voltage power to a load 230 such as a three-phase induction motor via an array of single-phase inverters (also referred to as power cells). The transformer 210 includes primary windings 212 that excite a number of secondary windings 214-225. Although primary winding 212 is illustrated as having a star configuration, a mesh configuration is also possible. Further, although secondary windings 214-225 are illustrated as having a mesh configuration, star-configured secondary windings are possible, or a combination of star and mesh windings may be used. Further, the number of secondary windings illustrated in FIG. 2 is merely exemplary, and other numbers of secondary windings are possible. The circuit may be used for medium voltage applications or, in some embodiments, other applications.

Any number of ranks of power cells are connected between the transformer 210 and the load 230. A "rank" is considered to be a three-phase set, or a group of power cells established across each of the three phases of the power delivery system. Referring to FIG. 2, rank 250 includes power cells 251-253, rank 260 includes power cells 261-263, rank 270 includes power cells 271-273, and rank 280 includes power cells 281-283. Fewer than four ranks, or more than four ranks, are possible. A central control system 295 sends command signals to local controls in each cell over fiber optics or another wired or wireless communications medium 290.

Figure 3A:
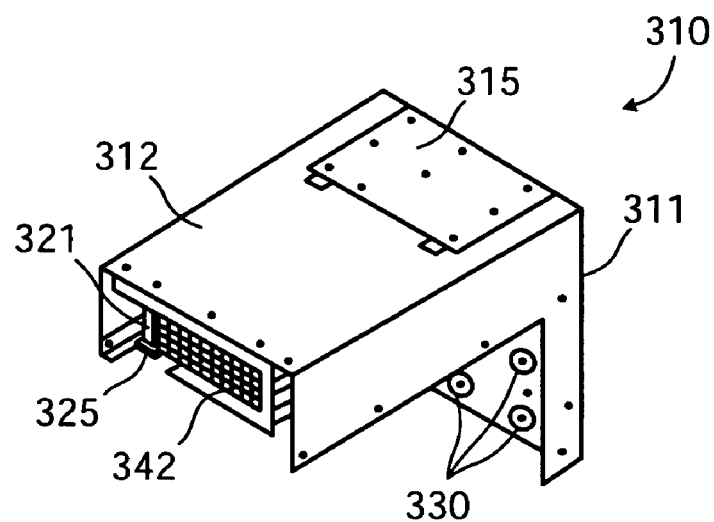
Figure 3B:
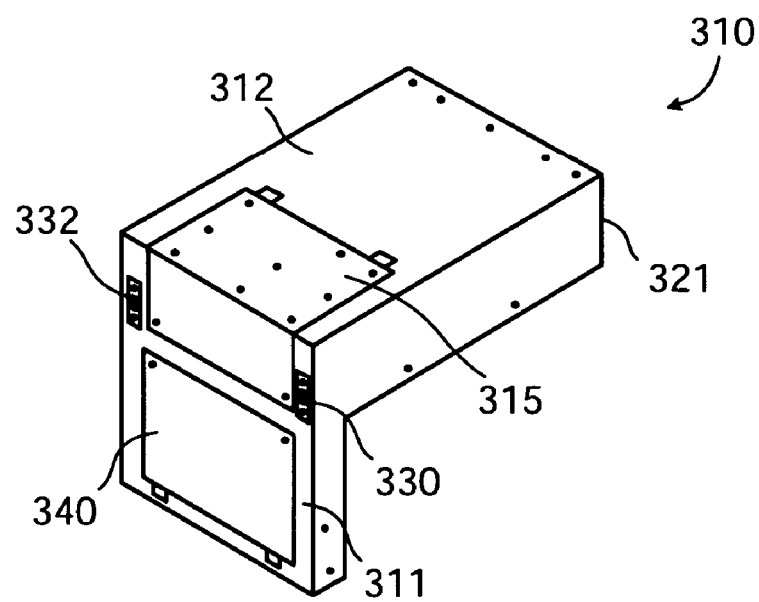

The power cells described in FIG. 2 provide a modular, multilevel system that allows cells to be replaced as needed to accommodate different design requirements, or to replace a failed cell. FIG. 3A illustrates a rear perspective view and FIG. 3B illustrates a front perspective view of exemplary power cell structure 310. The power cell 310 includes a chassis 312 and a plurality of power input/output connectors 325.

Figure 3C:
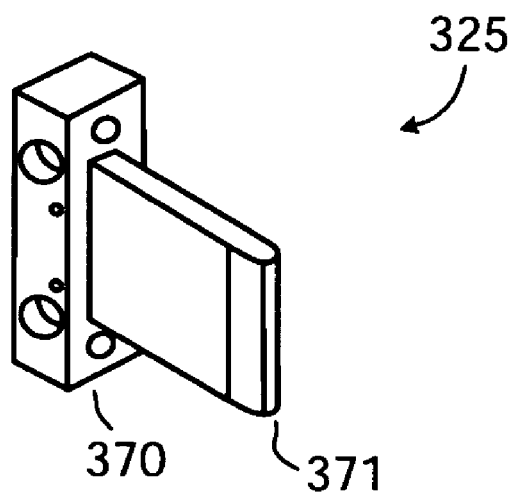
FIGS. 3C and 3D illustrate exemplary connecting members for the power cell structure.
Figure 3D:
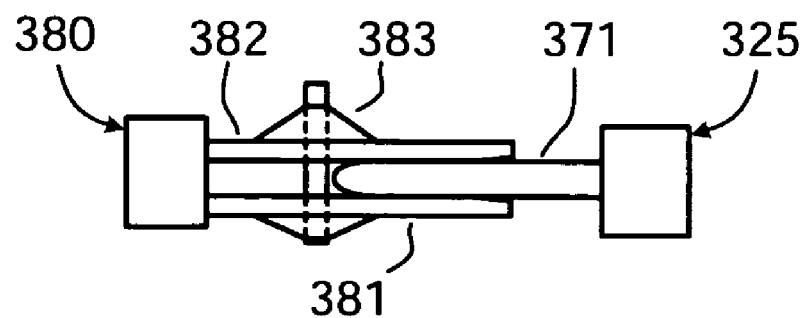

Referring to FIG. 3C, power connector 325 for the power cell may include a conducting arm 371 that extends from a mounting block 370. Referring to FIG. 3D, conducting arm 371 may be sized to make a secure electrical connection with a power connector 380 for the power bus. For example, conducting arm 371 may fit between and contact a pair of conducting arms 381, 382 of the power bus connector 380. In some embodiments, power bus connector 380 may include a support 383 that helps to make a substantially rigid connection. Other power connector configurations are possible. In addition, in some embodiments a structure similar to power bus connector 380 may be included with the power cell, while a structure similar to 325 may be included with the power bus.

Returning to FIGS. 3A and 3B, the chassis 312 encloses various components of the electronic module 310, such as one or more capacitors, printed circuit boards, heat sinks, etc. The chassis 312 may be fabricated from any suitable material, such as galvanized steel or another metal, that both mechanically and electromagnetically isolates the power cell from other power cells in the system during both normal operation and many abnormal operating conditions. The chassis 312 may serve to protect internal components of the electronic module 310 from damage during shipping and handling, and it may be configured in a manner such that the electronic module 310 can be placed on any of its sides without causing any damage to the components of the electronic module 310. According to various embodiments, the chassis 312 may be comprised of several portions connected together, and one or more portions of the chassis 312 may be removable. In addition, the chassis 312 may be of a thickness sufficient to prevent any debris resulting from a failure of the internal components of the electronic module 310 from exiting the space enclosed by the chassis 312, thereby preventing any collateral damage to other components in the vicinity of the electronic module 310. The chassis 312 may also serve to provide a low impedance path for arcing faults within the chassis to minimize potential damage caused thereby.

Exemplary internal components of the cell may include an electronics assembly that may include current-controlling devices or switches such as insulated gate bipolar transistor (IGBT) modules, other transistors, thyristors and one or more rectifier modules. The IGBTs may be separated for I/O bus locations and to increase thermal performance. The cell may include one or more control boards or other electronic devices that may be positioned near the front end 311 of the cell, with an optional access opening 315 covered by a door or panel that may be opened or removed. The interior front area of the cell may include a plurality of capacitor connectors 330 that receive capacitors for cell operation. The capacitors (not shown) may extend from the capacitor connectors toward the rear 321 of the cell or in another direction. The lower portion of the cell, where the capacitors are positioned, may be covered by a housing that serves as a lower portion (not shown) of chassis 312.

The cell 312 may contain a water cooling system to remove heat from the cell during operation. The cell's internal water cooling pipes may contain a water inlet connection 330 and water outlet connection 332 to receive cool water into the cell and expel water from the cell, respectively, via one or more hoses or conduits.

Figure 4:
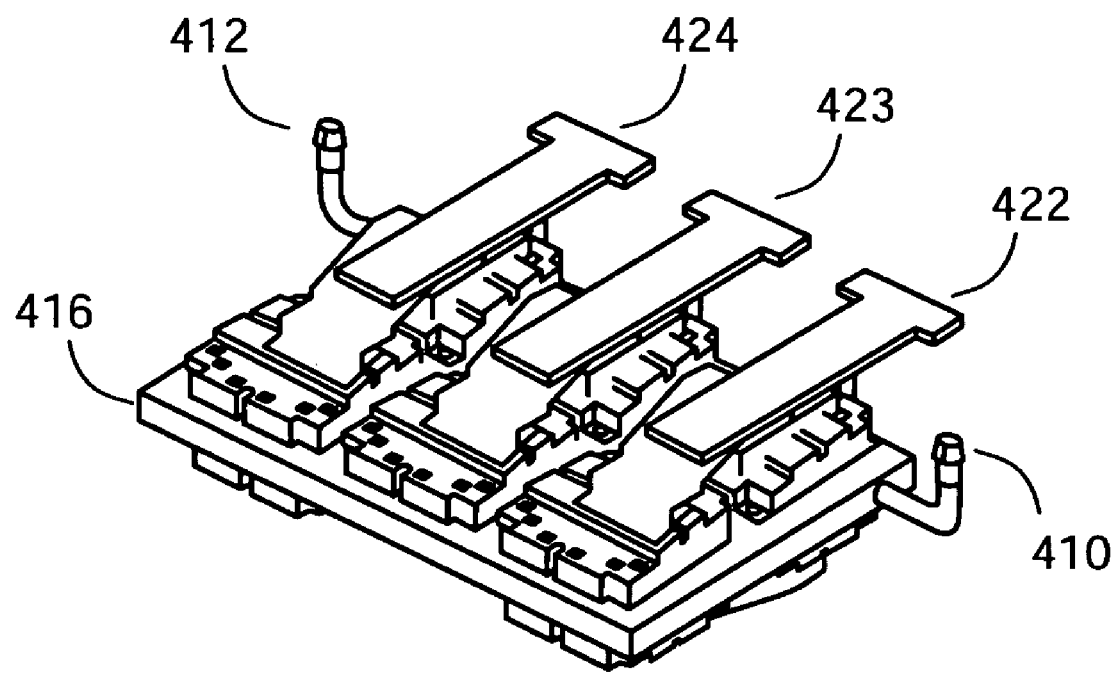
FIG. 4 illustrates an exemplary power cell internal structure.

Referring to FIG. 4, the hose connections may deliver water to and receive water from input water conduit 410 and output water conduit 412 that are connected to deliver fluid to and from a water cooled heat sink 416, which is a sealed container that holds cooling water at a position that is effective to absorb heat from components of the cell, such as a location under IGBT devices connected to busses 422, 423 and 424 and other components of the cell. Busses 422, 423 and 424 may be electrically connected to one or more power plugs 325 (see FIG. 3). A bus may be any electrically conductive delivery device, such as a wire, rigid or flexible piece of metal, conductive polymer, or another material. Referring to FIG. 3, the heat sink and IGBTs are typically located near the rear 321 of the cell. The water for the heat sink may cool the IGBTs. Deionized water is preferred, and the water may be recirculated to an air-to-water or water-to-water heat exchanger that is located external to the cell.

In addition to a water cooling structure, referring back to FIG. 3, each cell may include an air inlet 340 and an air outlet 342 that directs air through the cell 310 so that the air flows over components such as capacitor connections, electronics and control boards, power switches, bus connectors, and/or the busses themselves. Each of the air intake and output may be covered by a filter or grill in some embodiments. Preferably, the cell 310 components are positioned so that air flows first over the capacitor connections, and/or circuit boards, with air flow over the heat sink occurring later in the air stream. This occurs by positioning capacitor connections 330 and circuit boards (under opening 315) near the front of the cell, while positioning the heat sink 416 near the air outlet 342 or rear area 321 of the cell. Thus, the air may be cooler when it passes across components that are not also near the water-cooled heat sink, while air may be warmer in areas where the heat sink also provides cooling capability.

Figure 5:
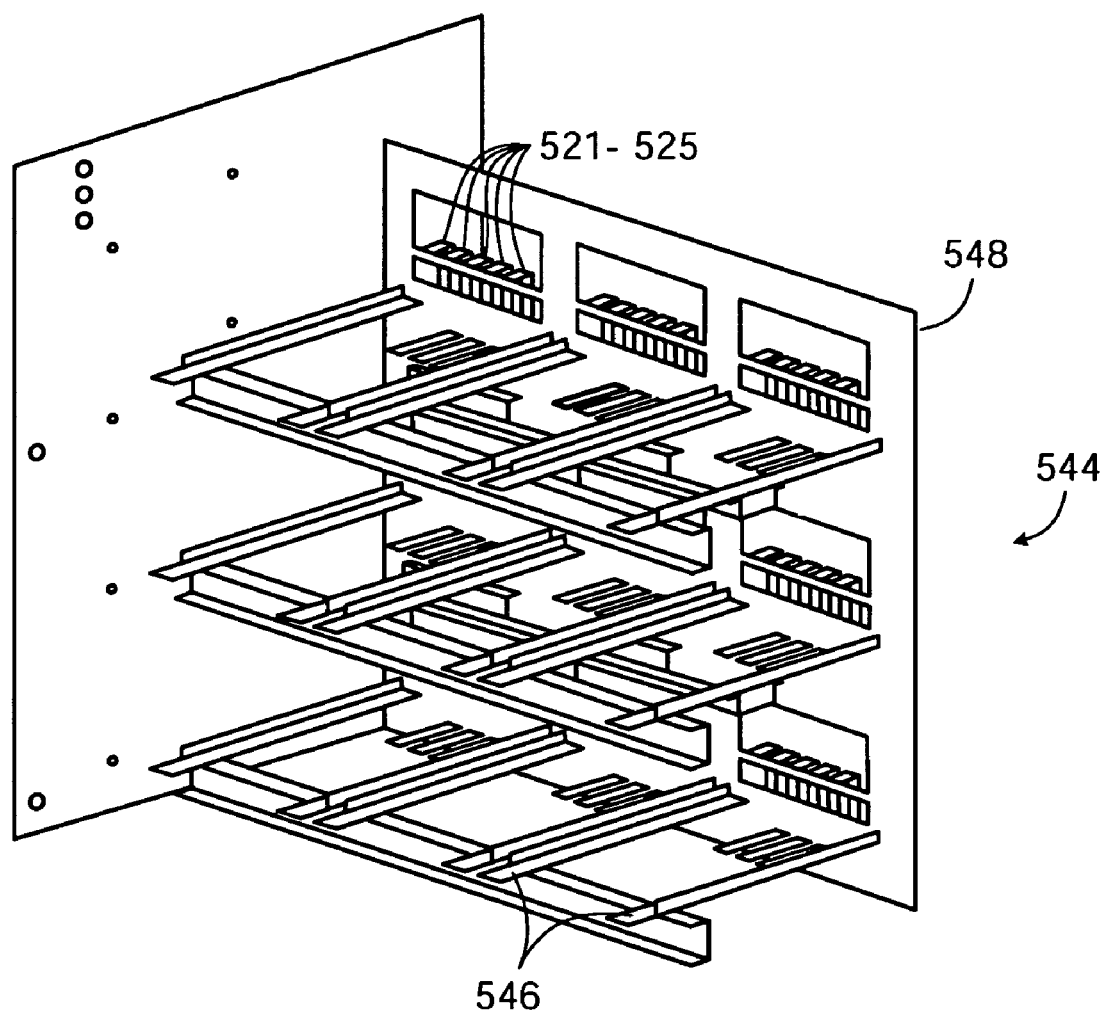
FIG. 5 illustrates an exemplary support structure for multiple power cells.

FIG. 5 illustrates an exemplary support structure 544 for multiple power cells, such as nine cells, within a housing wherein each power cell or other electronic module is positioned on one or more mounting rails 546 so that the rear of each cell faces a backplane 548 and the cell's power plugs contact the cell power connections 521-525 within an air plenum. The backplane 548 may be fabricated from any suitable non-conductive material, such as a high-strength non-conductive laminate material, and it separates the air plenum from the heat exchange system that removes heat from the individual cells.

Figure 6:
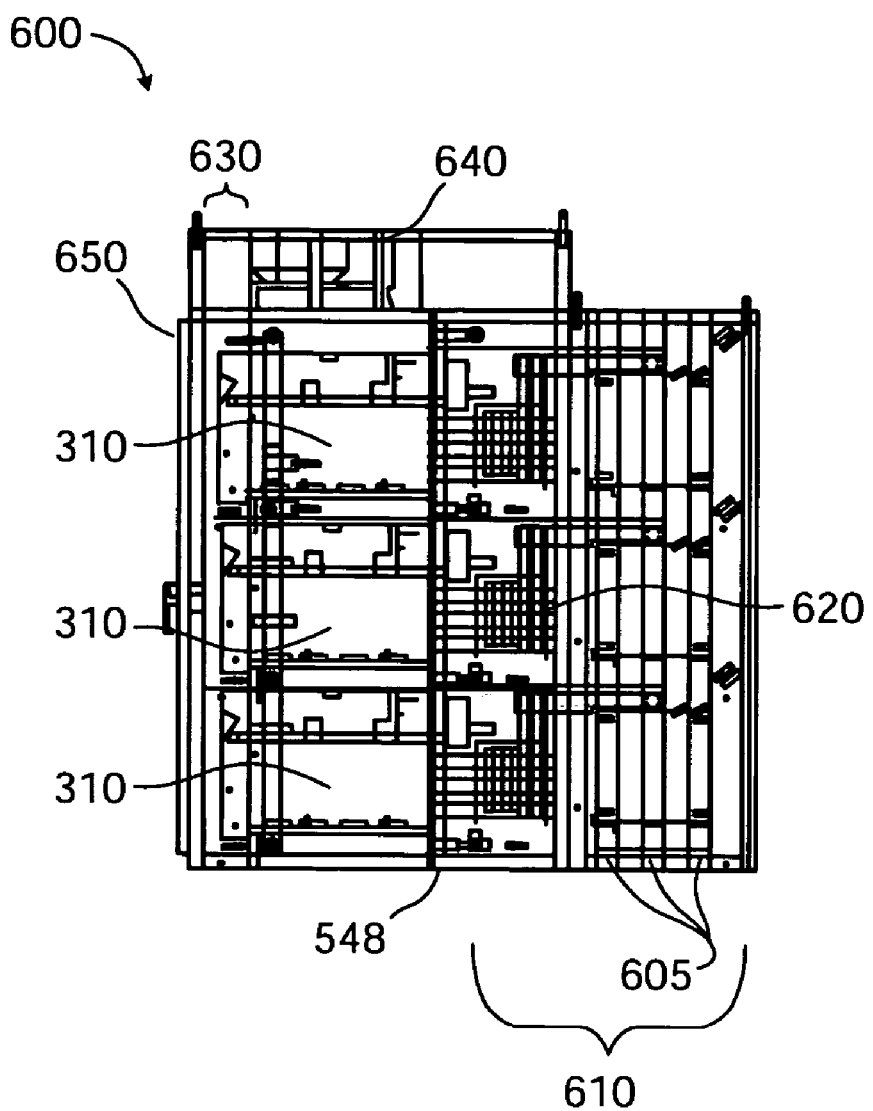
FIG. 6 illustrates an exemplary power cell system in a housing.

FIG. 6 illustrates an exemplary power cell system 600 containing any number of replaceable power cells 310 connected to power input/output buswork 605 via connecting buswork 620. Back plane 548 separates the power cells 310 from the air plenum 610. As air moves into the front of a cell, the air may absorb heat from the components of the cell. The air that leaves the cell at its rear and passes through an opening in the back plane 548 is typically warmer than the air that entered the cell. A heat exchanger 640 receives the warm or hot air from the air plenum 610, cools the air and returns cooled air to the front of the cells via an air delivery space 630 that is located within system housing 650. Any suitable air cooling system may be used as the heat exchanger 640. Preferably, heat exchanger 640 is located on or near the top of the housing 650, although other locations are possible. Thus, the system may direct air from the rear of the cells, through the heat exchanger in a constant, recirculating manner. In the forced air delivery system described herein, in some embodiments the recirculation of air may reduce ionization of the air and the arcing faults associated with such ionization.

Figure 7:
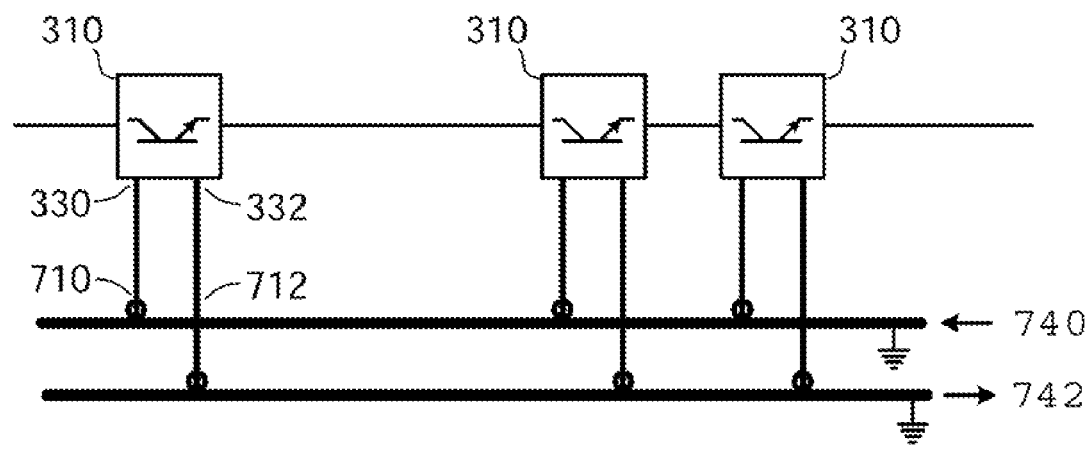
FIG. 7 illustrates an exemplary water delivery system.

FIG. 7 illustrates a water delivery system that also may be included within the housing. Each cell 310 has input and output hose connections 330 and 332 that are connected to water delivery 740 and return 742 manifolds via connecting conduits 710 and 712. Water manifolds and conduits may be made of any material suitable for delivering hot and cold water, such as noncorrosive metal, rubber, silicon, PVC, plastic or any other suitable material. The connections between hose connections 330 and 332 and connecting conduits 710 and 712 may be self-sealing so that an individual power cell can be removed from the system without breaking the water paths to other cells. Any suitable sealing device, such as a valve that opens upon connection and closes upon disconnection, may be used for this purpose. Water delivery 740 and return 742 manifolds may be located within the air plenum 610 of the power delivery system 600 (referring to FIG. 6). Water, preferably deionized, may be circulated to or from an external heat exchanger to be cooled.

In medium voltage systems, the air entering the cell may be controlled to a temperature of approximately 55° C., while the water delivered to the cells may be controlled to a temperature of approximately 47° C. Other temperatures are possible. The air and water may absorb heat while inside the cells, and the air and water exiting the cell may, in some embodiments, be several degrees warmer than the air and water that enters the cells.

Still other embodiments will become readily apparent to those skilled in this art from reading the above-recited detailed description and drawings of certain exemplary embodiments. It should be understood that numerous variations, modifications, and additional embodiments are possible, and accordingly, all such variations, modifications, and embodiments are to be regarded as being within the spirit and scope of this application.

What is claimed is:

1. A method of operating a power delivery system having at least one power cell comprising:
    providing at least one power cell electrically connected between a transformer and an electrical load being served;
    providing the power cell with one or more power connectors electrically connected to a backplane of a power cell system enclosure;
    directing air into the power cell to cool a first area of the cell;
    receiving the air from the power cell, wherein the air received from the cell is warmer than the air directed into the cell;
    cooling the received air and recirculating it to the power cell;
    directing water through a water intake to a water-cooled heat sink located proximate, and operably coupled to, a transistor module in a second area of the power cell to cool the second area of the cell, the transistor module being electrically connected to the one or more power connectors of the power cell via one or more busses;

receiving water from a water output, wherein water expelled through the water output is warmer than water directed into the water intake; and cooling the water and recirculating it to the power cell.

2. The method of claim 1, wherein the cell is contained within a support structure having an air plenum, the cooling is provided by a heat exchanger, and the receiving comprises directing air through the air plenum from the cell to the heat exchanger.

3. The method of claim 1, wherein: the cell comprises an air intake, an air output, and a plurality of capacitor connectors; the directing comprises directing the air through the air intake; the receiving comprises receiving the air from the air output; and the method further comprises passing the air over the water-cooled heat sink and the capacitor connectors so that the air passes over the capacitor connectors before passing over the heat sink.

4. The method of claim 3 wherein: the cell's heat sink is connected to the water intake and the water output.

5. The method of claim 1, wherein: the cell comprises an air intake, an air output, and a circuit board; the directing comprises directing the air through the air intake; the receiving comprises receiving the air from the air output; and the method further comprises passing the air over the water-cooled heat sink and the circuit board so that the air passes over the circuit board before passing over the heat sink.

6. The method of claim 1, wherein the cooling comprises cooling the air to approximately 55° C.

7. The method of claim 1, wherein the recirculating reduces air ionization.

8. A method of operating a power delivery system having a plurality of power cells comprising:
   providing at least one of the plurality of power cells electrically connected between a transformer and an electrical load being served;
   directing air into the plurality of power cells, wherein each cell comprises an air intake, an air output, a water-cooled heat sink located proximate and operably coupled to, a transistor module in a back area of the cell, and a plurality of capacitor connectors located in a front area of the cell, wherein the directing comprises directing the air through the air intake of each cell such that the air cools the capacitor connectors;
   passing the air over the water-cooled heat sink and the capacitor connectors of each cell so that the air passes over the capacitor connectors before passing over the heat sink;
   receiving the air from the power cells;
   cooling the received air and recirculating it to the power cells;
   directing water through a water intake to the heat sink of each cell and receiving water from a water output such that the water in each heat sink cools the transistor module of its associated cell; and
   cooling the water and recirculating it to the power cells.

9. The method of claim 8, wherein the cells are contained within a support structure having an air plenum, the cooling is provided by a heat exchanger, and the receiving comprises directing air through the air plenum from the cells to the heat exchanger.

10. The method of claim 8 wherein: each cell's heat sink is connected to a water intake and a water output; and during operation, water that is expelled through the water output by a cell is warmer than water that is received into the water intake of the same cell.

11. The method of claim 8, wherein: each cell further comprises a circuit board; the passing further comprises passing the air over the circuit board before the air passes over the heat sink of a cell.

12. The method of claim 8, wherein the recirculating reduces air ionization.

* * * * *